(12) United States Patent
Shigemasa (10) Patent No.: US 12,525,978 B2
(45) Date of Patent: Jan. 13, 2026

(54) ELECTRONIC CIRCUIT (71) Applicant: Sharp Semiconductor Innovation Corporation, Tenri (JP)

(72) Inventor: Haruhiko Shigemasa, Tenri (JP)

(73) Assignee: Sharp Semiconductor Innovation Corporation, Tenri (JP)

( * ) Notice: Subject to any disclaimer, the term of this patent is extended or adjusted under 35 U.S.C. 154(b) by 47 days.

(21) Appl. No.: 18/398,917

(22) Filed: Dec. 28, 2023

(65) Prior Publication Data

US 2024/0291490 A1 Aug. 29, 2024

(30) Foreign Application Priority Data

Jan. 31, 2023 (JP) ................ 2023-013040

(51) Int. Cl.
*H03K 19/00* (2006.01)
*H03K 3/012* (2006.01)
*H03K 19/0185* (2006.01)

(52) U.S. Cl.
CPC ..... *H03K 19/018514* (2013.01); *H03K 3/012* (2013.01); *H03K 19/0016* (2013.01)

(58) Field of Classification Search
CPC ........... H03K 19/018514; H03K 3/012; H03K 19/0016; G06F 7/58; G06F 7/588
See application file for complete search history.

(56) References Cited

U.S. PATENT DOCUMENTS

| | | | | | |
|---|---|---|---|---|---|
| 4,395,703 | A | * | 7/1983 | Piosenka | G06F 7/588 708/250 |
| 5,706,218 | A | * | 1/1998 | Hoffman | H04L 9/0866 708/251 |
| 6,247,033 | B1 | * | 6/2001 | Kowalski | H03K 3/84 708/255 |
| 7,188,131 | B2 | * | 3/2007 | Bardouillet | G06F 7/588 708/3 |
| 2006/0049882 | A1 | * | 3/2006 | Kim | G06F 7/588 331/78 |
| 2015/0146869 | A1 | | 5/2015 | Yamamoto et al. | |
| 2021/0357185 | A1 | * | 11/2021 | Cagli | H03K 3/84 |

FOREIGN PATENT DOCUMENTS

JP 6167876 B2 7/2017

* cited by examiner

*Primary Examiner* — Tuan T Lam
(74) *Attorney, Agent, or Firm* — ScienBiziP, P.C.

(57) ABSTRACT

An electronic circuit includes the following: a first circuit configured to generate a first output having a first voltage-rise time; a second circuit configured to vary, in accordance with data included in challenge data, the first output to a second output having a second voltage-rise time different from the first voltage-rise time; and a third circuit in which an initial value is inconstant, and in which an output value varies in accordance with the second voltage-rise time.

16 Claims, 11 Drawing Sheets

ELECTRONIC CIRCUIT

BACKGROUND

Technical Field

The present disclosure relates to an electronic circuit. The present application claims priority from Japanese Application No. JP2023-013040, filed on Jan. 31, 2023, the content of which is hereby incorporated by reference into this application.

Description of the Related Art

Japanese Patent No. 6167876 discloses a latch PUF.

The latch PUF is equipped with an RS latch circuit. In the latch PUF, the ratio of the RS latch circuit that outputs a random number, or the RS latch circuit that outputs a constant is varied by changing the frequency of a clock signal that is input to an input terminal of the RS latch circuit. This can improve the quality of individual-specific information that is generated by the latch PUF (paragraphs 0033 and 0034).

SUMMARY

In the latch PUF disclosed in Japanese Patent No. 6167876, the entropy of generated individual-specific information remains insufficient.

The present disclosure has been made in view of this problem. One aspect of the present disclosure aims to provide an electronic circuit that can generate response data having a high entropy to, for instance, challenge data.

An electronic circuit according to one aspect of the present disclosure includes the following: a first circuit configured to generate a first output having a first voltage-rise time; a second circuit configured to vary, in accordance with data included in challenge data, the first output to a second output having a second voltage-rise time different from the first voltage-rise time; and a third circuit in which an initial value is inconstant, and in which an output value varies in accordance with the second voltage-rise time.

DETAILED DESCRIPTION OF THE DISCLOSURE

An embodiment of the present disclosure will be described with reference to the drawings. It is noted that identical or equivalent components will be denoted by the same signs throughout the drawings, and that the description of redundancies will be omitted.

1 First Embodiment

1.1 Outline of Electronic Circuit

Figure 1:
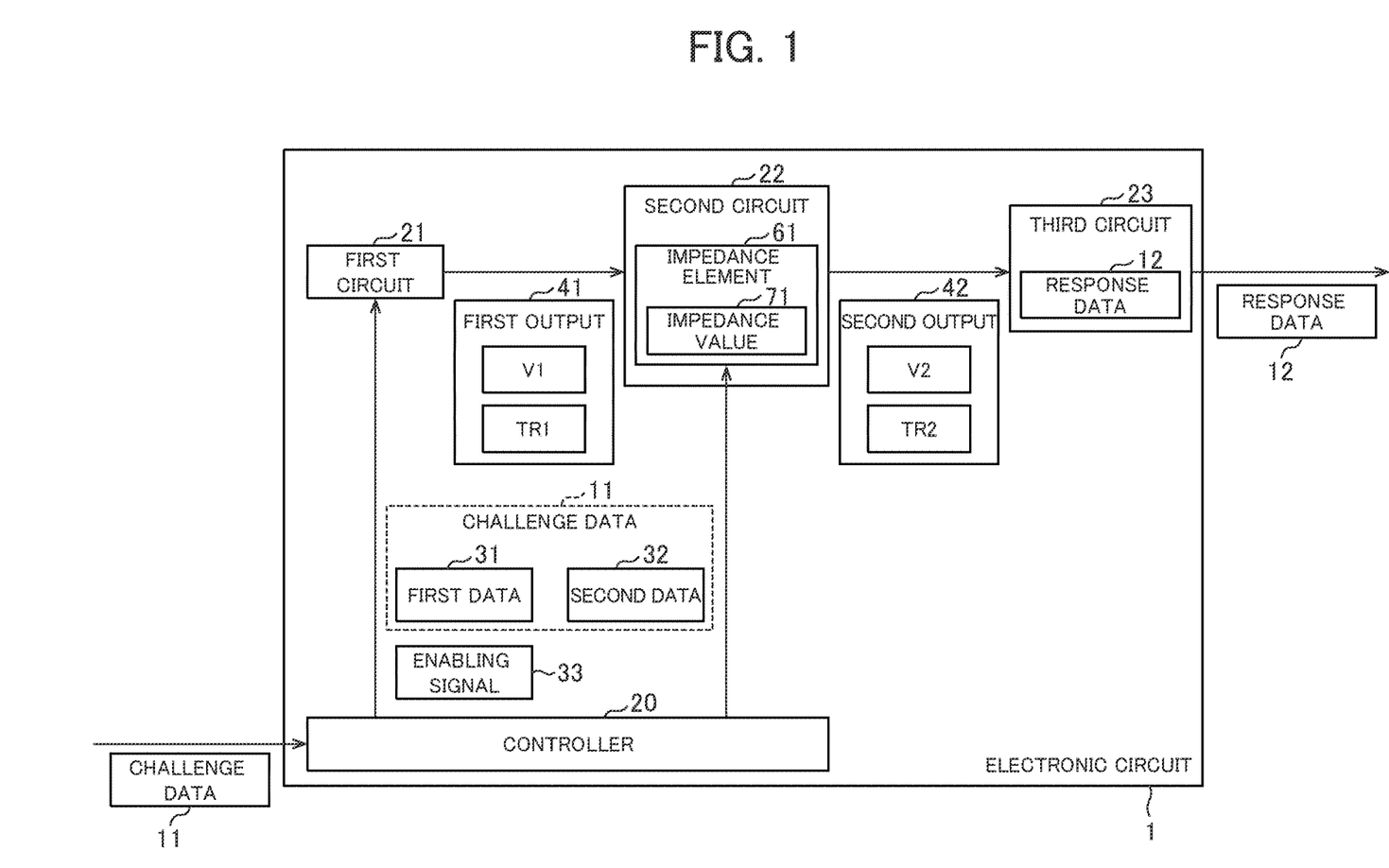
FIG. 1 is a block diagram of an electronic circuit according to a first embodiment.

FIG. 1 is a block diagram of an electronic circuit according to a first embodiment.

An electronic circuit 1 illustrated in in FIG. 1 generates a physically unclonable function (PUF). The electronic circuit 1 generates response data 12 in response to challenge data 11 using the generated PUF. The generated response data 12 is also called PUF data or other things. The generated PUF is a function that is different from electronic circuit 1 to electronic circuit 1, that is, specific to the individual electronic circuit 1. The generated PUF is a function that is different from electronic circuit 1 to electronic circuit 1, that is, specific to the individual electronic circuit 1. The response data 12 has a high entropy. It is hence difficult to predict a change in the response data 12 in response to a change in the challenge data 11. In view of these facts, the electronic circuit 1 is suitably mounted on an authentication device, a random-number generator, and other devices.

The electronic circuit 1 uses that data that is retained after startup by a retention element whose initial value is inconstant, such as an RS latch, a D-type flip-flop without a reset function, or a random-access-memory cell, varies in accordance with a rise in an input signal.

The challenge data 11 is input to the electronic circuit 1. The input challenge data 11 is an n-digit bit string for instance. For instance, n is 16. The challenge data 11 is also called a challenge code or other things. The electronic circuit 1 outputs the response data 12. The output response data 12 is an m-digit bit string for instance. For instance, m is 8. The response data 12 is also called a response code or other things.

1.2 Configuration of Electronic Circuit

As illustrated in FIG. 1, the electronic circuit 1 includes a controller 20, a first circuit 21, a second circuit 22, and a third circuit 23.

The controller 20 receives the challenge data 11. The controller 20 generates first data 31 and second data 32 from the input challenge data 11. The generated first data 31 and second data 32 are included in the challenge data 11. The first data 31 and the second data 32 are different from each other. When the challenge data 11 is a 16-digit bit string, the first data 31 is, for instance, a 4-digit bit string included in the 16-digit bit string. The 4-digit bit string is, for instance, a bit string [15:12] from the fifteenth digit to the twelfth digit. Further, the second data 32 is, for instance, a 12-digit bit string included in the 16-digit bit string. The 12-digit bit string is, for instance, a bit string [11:0] from the eleventh digit to the zeroth digit.

The controller 20 inputs the generated first data 31 and second data 32 to the first circuit 21 and second circuit 22, respectively.

The first circuit 21 generates a first output 41. The generated first output 41 is a direct current. The first output 41 has a first post-rise voltage V1. The voltage of the first output 41 rises from 0 V to the first post-rise voltage V1 and stabilizes at the first post-rise voltage V1 after rising to the first post-rise voltage V1. The time rate of change, $\Delta V/\Delta t$, in the voltage of the first output 41 decreases with time to approach zero while the voltage of the first output 41 rises, and the time rate of change becomes zero after the voltage of the first output 41 becomes stable. The first output 41 has a first voltage-rise time TR1. The first voltage-rise time TR1 is the index of a time that is necessary for the voltage of the first output 41 to rise from 0 V to the first post-rise voltage V1. In the first embodiment, the first voltage-rise time TR1 is defined as a time that is necessary for the voltage of the first output 41 to rise from 0 V to 90% of the first post-rise voltage V1.

The first circuit 21 is a variable-voltage circuit in which the first post-rise voltage V1 varies. The first circuit 21 varies the first post-rise voltage V1 in accordance with the input first data 31.

The first circuit 21 starts generating the first output 41 in synchronization with input of an enabling signal 33.

The second circuit 22 has an input electrically connected to the output of the first circuit 21. The second circuit 22 thus receives the first output 41 generated by the first circuit 21.

As illustrated in FIG. 1, the second circuit 22 at least one impedance element 61.

When the at least one impedance element 61 is composed of two or more impedance elements, the two or more impedance elements are electrically connected to each other, to constitute an impedance element network.

The at least one impedance element 61 varies the input first output 41 to a second output 42. Accordingly, the second circuit 22 including the at least one impedance element 61 varies the first output 41 to the second output 42. The second output 42 is a direct current. The second output 42 has a second post-rise voltage V2. The voltage of the second output 42 rises from 0 V to the second post-rise voltage V2 and stabilizes at the second post-rise voltage V2 after rising to the second post-rise voltage V2. The time rate of change, $\Delta V/\Delta t$, in the voltage of the second output 42 decreases with time to approach zero while the voltage of the second output 42 rises, and the time rate of change becomes zero after the voltage of the second output 42 becomes stable. The second output 42 has a second voltage-rise time TR2. The second voltage-rise time TR2 is the index of a time that is necessary for the voltage of the second output 42 to rise from 0 V to the second post-rise voltage V2. In the first embodiment, the second voltage-rise time TR2 is defined as a time that is necessary for the voltage of the second output 42 to rise from 0 V to 90% of the second post-rise voltage V2. The second post-rise voltage V2 is almost the same as the first post-rise voltage V1. The second voltage-rise time TR2 is different from the first voltage-rise time TR1. Thus, the at least one impedance element 61 varies a voltage-rise time TR from the first voltage-rise time TR1 to the second voltage-rise time TR2.

At least one impedance element 61 is a variable-impedance element in which at least one impedance value 71 of the at least one impedance element 61 varies. The at least one impedance element 61 varies at least one impedance value 71 in accordance with the input second data 32. Accordingly, the at least one impedance element 61 varies the first output 41, having the first voltage-rise time TR1, to the second output 42, having the second voltage-rise time TR2, in accordance with the second data 32. Thus, the second circuit 22 varies the voltage-rise time TR from the first voltage-rise time TR1 to the second voltage-rise time TR2.

The third circuit 23 has an input electrically connected to the output of the second circuit 22. The third circuit 23 thus receives the second output 42 sent from the second circuit 22.

The third circuit 23 retains logical data and outputs the retained logical data.

An initial value that is output by the third circuit 23 after the start of power-source electric power to the third circuit 23 is inconstant. The supply of the power-source electric power to the third circuit 23 may be performed by the first circuit 21, or another power source different from the first circuit 21.

An output value that is output by the third circuit 23 after the second output 42 is input to the third circuit 23 varies in accordance with the input second output 42. The output value varies in accordance with the second post-rise voltage V2 and second voltage-rise time TR2 of the input second output 42. The second post-rise voltage V2 of the second output 42 is almost the same as the first post-rise voltage V1 of the first output 41, and the first post-rise voltage V1 of the first output 41 varies in accordance with the first data 31, included in the challenge data 11. Further, the second voltage-rise time TR2 of the second output 42 varies in accordance with the second data 32, included in the challenge data 11. Thus, the output value varies in accordance with the challenge data 11.

The third circuit 23 retains the response data 12. The retained response data 12 is an output value that is output by the third circuit 23 after the second output 42 is input to the third circuit 23. The response data 12 thus varies in accordance with the second post-rise voltage V2 and second voltage-rise time TR2 of the input second output 42 and varies in accordance with the challenge data 11.

The third circuit 23 outputs the retained response data 12.

The controller 20, the first circuit 21, the second circuit 22, and the third circuit 23 may be composed of discrete components or an integrated circuit, or they may be incorporated in an integrated circuit. The controller 20 may be, in whole or in part, composed of a processor that executes a program stored in a memory.

1.3 Impedance Element

Figure 2:
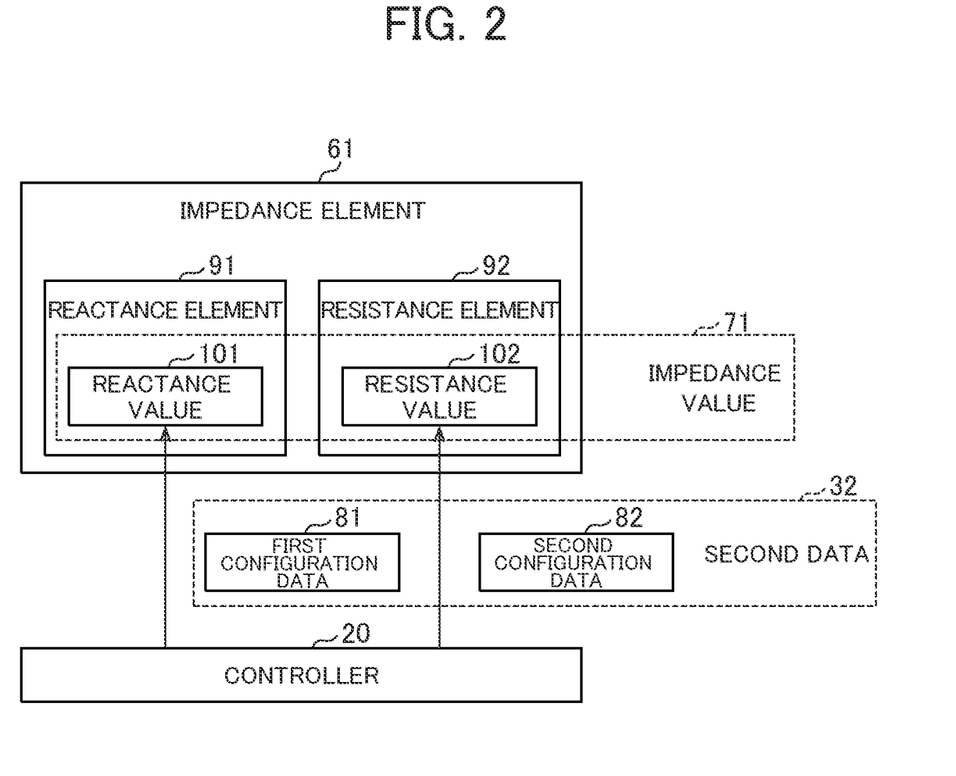
FIG. 2 is a block diagram of a controller and at least one impedance element both included in the electronic circuit according to the first embodiment.

FIG. 2 is a block diagram of the controller and at least one impedance element included in the electronic circuit according to the first embodiment.

As illustrated in FIG. 2, the second data 32 that is input to the at least one impedance element 61 is composed of first configuration data 81 and second configuration data 82.

When the challenge data 11 is a 16-digit bit string, each of the first configuration data 81 and second configuration data 82 is, for instance, a 6-digit bit string. The 6-digit bit string that constitutes the first configuration data 81 is, for instance, a bit string [5:0] from the fifth digit to the zeroth digit. Further, the 6-digit bit string that constitutes the second configuration data 82 is, for instance, a bit string [11:6] from the eleventh digit to the sixth digit.

The at least one impedance element 61 includes a reactance element (capacitor or inductor) 91 or a resistance element (resistor) 92. Thus, the at least one impedance value 71 includes a reactance value 101, which belongs to the reactance element 91, and a resistance value 102, which belongs to the resistance element 92.

The reactance element 91 is a variable-reactance element whose reactance value 101 varies. The reactance element 91 varies the reactance value 101 in accordance with the input first configuration data 81. The resistance element 92 is a variable resistor whose resistance value 102 varies. The resistance element 92 varies the resistance value 102 in accordance with the input second configuration data 82.

The reactance element 91 may be a capacitive reactance element (capacitor), or an inductive reactance element (inductor). Thus, the reactance value 101 may be a capacitive reactance value, or an inductive reactance value. However, the reactance element 91 that is a capacitive reactance element, and whose reactance value 101 is a capacitive reactance value facilitates integration of the second circuit 22 into an integrated circuit when compared with the reactance element 91 that is an inductive reactance element, and whose reactance value 101 is an inductive reactance value. When the reactance element 91 is a capacitive reactance element, the reactance value 101 is expressed by $1/j\omega C$ ($\omega=2\pi f$), where f denotes a frequency, where C denotes the capacitance value of the capacitive reactance element. When the reactance element 91 is an inductive reactance element, the reactance value 101 is expressed by $j\omega L$ ($\omega=2\pi f$), where f denotes a frequency, where L denotes the inductance value of the inductive reactance element.

1.4 First Circuit

Figure 3:
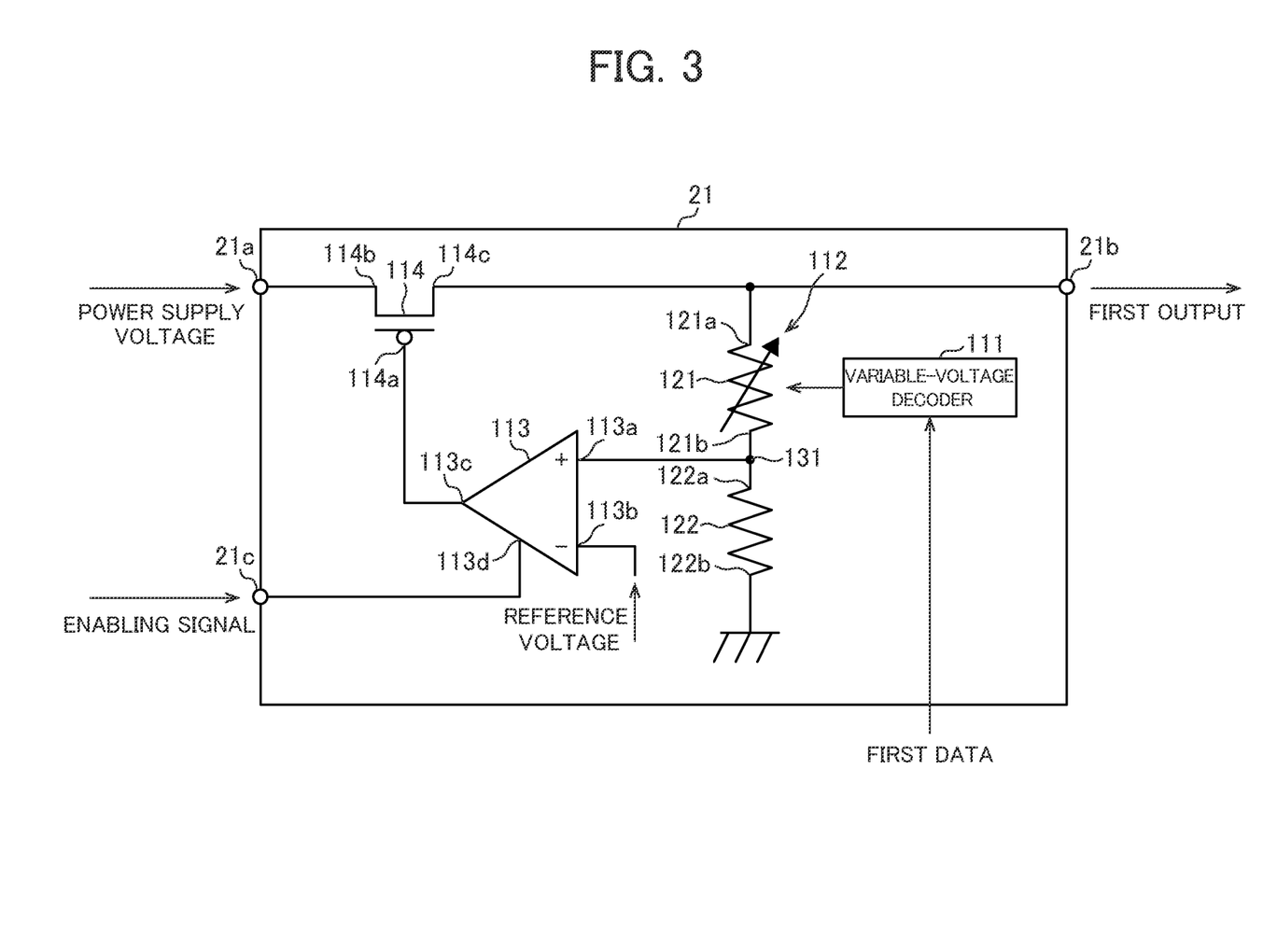
FIG. 3 is a circuit diagram of a first circuit included in the electronic circuit according to the first embodiment.

FIG. 3 is a circuit diagram of the first circuit included in the electronic circuit according to the first embodiment.

The first circuit 21 illustrated in FIG. 3 is a buck regulator. The first circuit 21 can thus generate the first output 41 having a constant voltage lower than a power supply voltage that is input.

As illustrated in FIG. 3, the first circuit 21 includes an input terminal 21a, an output terminal 21b, and an input terminal 21c.

The power supply voltage is input to the input terminal 21a. The first output 41 is output from the output terminal 21b. The enabling signal 33 is input to the input terminal 21c.

As illustrated in FIG. 3, the first circuit 21 includes a variable-voltage decoder 111, a voltage-dividing circuit 112, an error amplifier 113, and a control element 114.

The variable-voltage decoder 111 decodes the input first data 31, to generate a control signal.

The voltage-dividing circuit 112 divides a voltage that is output by the first circuit 21, to output the divided voltage. The voltage-dividing circuit 112 varies the divided voltage in accordance with the generated control signal.

As illustrated in FIG. 3, the voltage-dividing circuit 112 includes a first voltage-dividing resistor 121 and a second voltage-dividing resistor 122.

The first voltage-dividing resistor 121 has a first terminal 121a electrically connected to the output terminal 21b of the first circuit 21. The second voltage-dividing resistor 122 has a first terminal 122a electrically connected to a second terminal 121b of the first voltage-dividing resistor 121. The second voltage-dividing resistor 122 has a second terminal 122b grounded.

Accordingly, the voltage-dividing circuit 112 outputs a voltage divided from a node 131, which the second terminal 121b of the first voltage-dividing resistor 121 and the first terminal 122a of the second voltage-dividing resistor 122 are electrically connected to, while a voltage is output from the output terminal 21b of the first circuit 21. The divided voltage is determined by the ratio of resistance between the first voltage-dividing resistor 121 and second voltage-dividing resistor 122.

The voltage-dividing circuit 112 varies the divided voltage in accordance with the generated control signal, by varying the resistance value of the first voltage-dividing resistor 121 in accordance with the generated control signal.

The error amplifier 113 raises a voltage that is output from an output terminal 113c of the error amplifier 113 along with increase in a difference obtained by subtracting a voltage input to an inverting input terminal 113b of the error amplifier 113 from a voltage input to a non-inverting input terminal 113a of the error amplifier 113.

The non-inverting input terminal 113a of the error amplifier 113 is electrically connected to the node 131. The inverting input terminal 113b of the error amplifier 113 is electrically connected to a reference voltage source.

Accordingly, the error amplifier 113 raises the voltage that is output from the output terminal 113c of the error amplifier 113 along with increase in a difference obtained by subtracting, from the divided voltage, the reference voltage that is generated by the reference voltage source.

The error amplifier 113 also starts outputting the voltage from the output terminal 113c of the error amplifier 113 in synchronization with the input of the enabling signal 33 to an enabling terminal 113d of the error amplifier 113.

The enabling terminal 113d of the error amplifier 113 is electrically connected to the input terminal 21c of the first circuit 21.

Accordingly, the error amplifier 113 starts outputting the voltage from the output terminal 113c of the error amplifier 113 in synchronization with the input of the enabling signal 33 to the input terminal 21c of the first circuit 21.

The control element 114 strongly limits a current that flows from a first terminal 114b of the control element 114 through a second terminal 114c of the control element 114 along with increase in a voltage input to a control terminal 114a of the control element 114.

The control terminal 114a of the control element 114 is electrically connected to the output terminal 113c of the error amplifier 113. The first terminal 114b of the control element 114 is electrically connected to the input terminal 21a of the first circuit 21. The second terminal 114c of the control element 114 is electrically connected to the output terminal 21b of the first circuit 21.

Accordingly, the control element 114 strongly limits a current that flows from the input terminal 21a of the first circuit 21 through the output terminal 21b of the first circuit 21 along with increase in the voltage that is output from the output terminal 113c of the error amplifier 113. Accordingly, the control element 114 lowers a voltage that is output from the output terminal 21b of the first circuit 21 along with increase in a difference obtained by subtracting the reference voltage from the divided voltage.

Accordingly, the first circuit 21 stabilizes the voltage that is output from the output terminal 21b, at the first post-rise voltage V1, which varies in accordance with the first data 31.

1.5 Second Circuit

Figure 4:
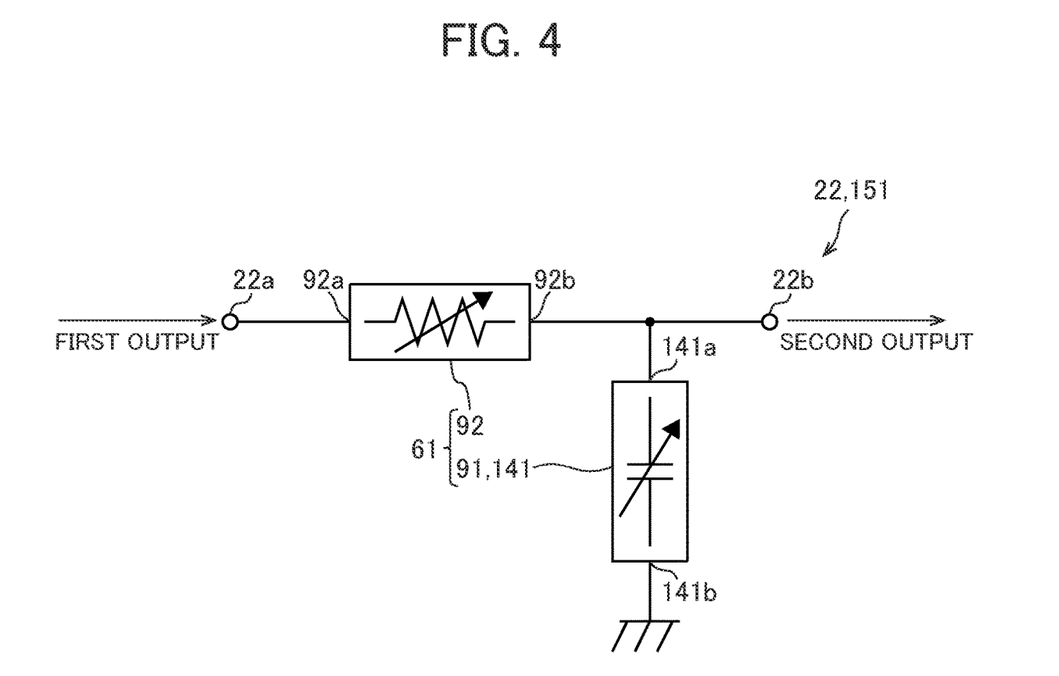
FIG. 4 is a circuit diagram of an example of a second circuit included in the electronic circuit according to the first embodiment.

FIG. 4 is a circuit diagram of an example of the second circuit included in the electronic circuit according to the first embodiment.

As illustrated in FIG. 4, in this example of the second circuit 22, the reactance element 91 is a capacitive reactance element (capacitor) 141, and the reactance value 101 is a capacitive reactance value.

The capacitive reactance element 141 is a variable-capacitance element whose capacitance value varies. The capacitive reactance element 141 varies the capacitance value in accordance with the input first configuration data 81. Accordingly, the capacitive reactance element 141 varies the capacitive reactance value in accordance with the input first configuration data 81.

As illustrated in FIG. 4, the second circuit 22 includes an input terminal 22a and an output terminal 22b.

The resistance element (resistor) 92 has a first terminal 92a electrically connected to the input terminal 22a of the second circuit 22. The resistance element 92 has a second terminal 92b electrically connected to the output terminal 22b of the second circuit 22. The capacitive reactance element 141 has a first terminal 141a electrically connected to the output terminal 22b of the second circuit 22. The capacitive reactance element 141 has a second terminal 141b grounded. Accordingly, the input of the resistance element 92 is electrically connected to the output of the first circuit 21. Further, the input of the capacitive reactance element 141 is electrically connected to the output of the resistance element 92. Further, the input of the third circuit 23 is electrically connected to the output of the capacitive reactance element 141. The second circuit 22 also includes an integrator circuit 151 including the resistance element 92 and capacitive reactance element 141. The integrator circuit 151 integrates the first output 41. The integrator circuit 151 thus varies the voltage-rise time TR of the second output 42 from the first voltage-rise time TR1 to the second voltage-rise time TR2.

1.6 Third Circuit

Figure 5:
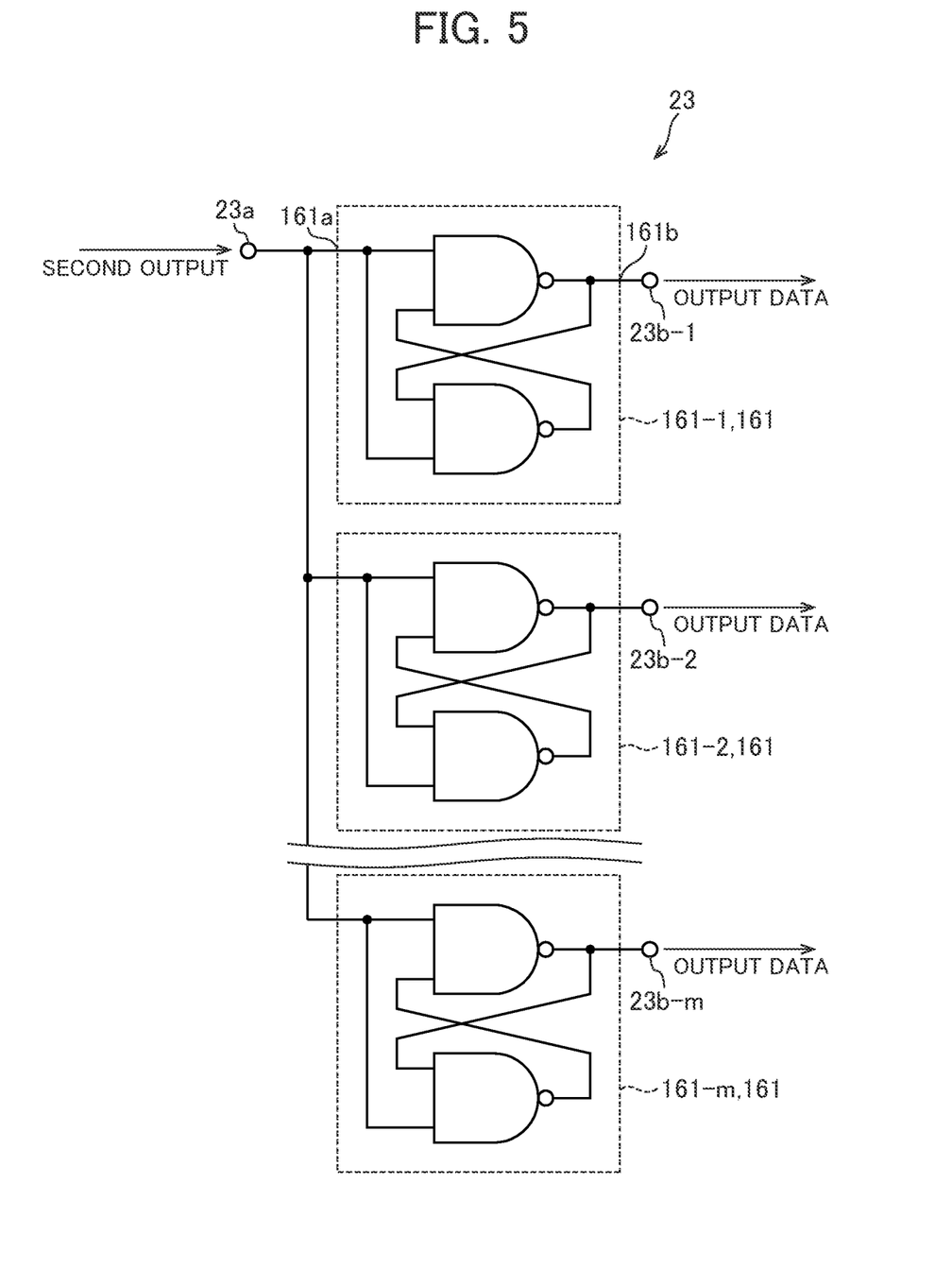
FIG. 5 is a circuit diagram of a first example of a third circuit included in the electronic circuit according to the first embodiment.

FIG. 5 is a circuit diagram of a first example of the third circuit included in the electronic circuit according to the first embodiment.

In the first example of the third circuit 23, the third circuit 23 includes an input terminal 23a, and m output terminals 23b-1, 23b-2, . . . and 23b-m, as illustrated in FIG. 5.

As illustrated in FIG. 5, the third circuit 23 includes m RS latches 161-1, 161-2, . . . and 161-m.

Each RS latch 161 included in the RS latches 161-1, 161-2, . . . and 161-m retains a logical value that is indicated by a signal input to an input terminal 161a of the RS latch 161, and each RS latch 161 outputs a signal indicating the retained logical value from an output terminal 161b of the RS latch 161. However, an initial value that is retained by each RS latch 161 after the start of the supply of the power-source electric power to the RS latch 161 is inconstant. Further, an output value that is retained by each RS latch 161 after the signal is input to the input terminal 161a of the RS latch 161 varies in accordance with the post-rise voltage and voltage-rise time of this signal. The same logical value is not necessarily output from the output terminals 161b of the RS latches 161-1, 161-2, . . . and 161-m even when the same signal is input to the input terminals 161a of the RS latches 161-1, 161-2, . . . and 161-m. That is, the logical value that is output from the output terminal 161b of each RS latch 161 is a logical value specific to the RS latch 161.

The input terminals 161a of the RS latches 161-1, 161-2, . . . and 161-m are electrically connected to the input terminal 23a of the third circuit 23. The output terminals 161b of the RS latches 161-1, 161-2, . . . and 161-m are electrically connected to the respective output terminals 23b-1, 23b-2, . . . 23b-m of the third circuit 23.

Accordingly, the third circuit 23 outputs the response data 12, which varies in accordance with the second post-rise voltage V2 and second voltage-rise time TR2 of the second output 42, from the m output terminals 23b-1, 23b-2, . . . and 23b-m. The output response data 12 consists of m pieces of output data indicated by respective signals that are output from the m output terminals 23b-1, 23b-2, . . . and 23b-m.

Figure 6:
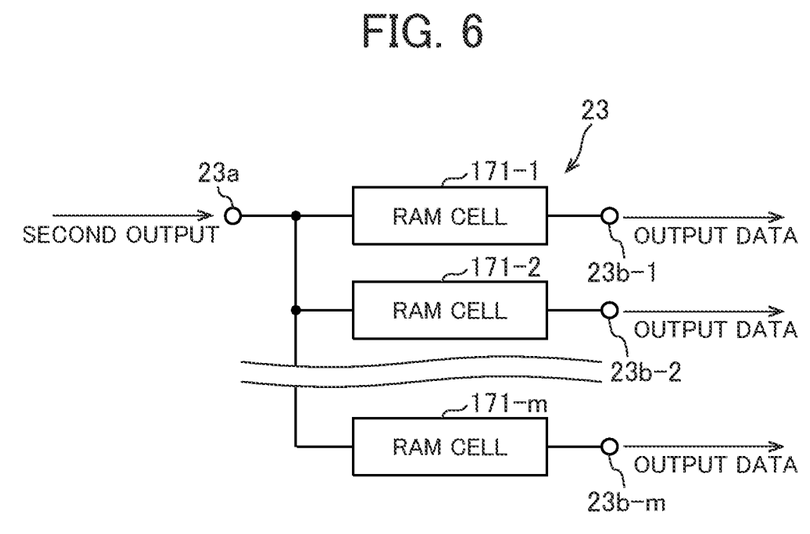
FIG. 6 is a block diagram of a second example of the third circuit included in the electronic circuit according to the first embodiment.

As illustrated in FIG. 6, the third circuit 23 in a second example includes m random-access-memory (RAM) cells 171-1, 171-2, . . . and 171-m instead of the m RS latches 161-1, 161-2, . . . and 161-m. The RAM is, but not limited to, a static RAM (SRAM).

Figure 7:
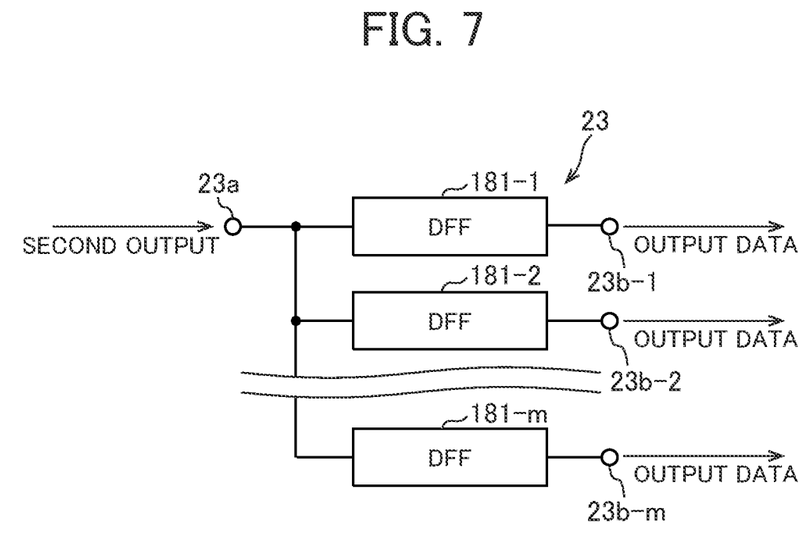
FIG. 7 is a block diagram of a third example of the third circuit included in the electronic circuit according to the first embodiment.

FIG. 7 is a block diagram of a third example of the third circuit included in the electronic circuit according to the first embodiment.

As illustrated in FIG. 7, the third circuit 23 in the third example includes, instead of the m RS latches 161-1, 161-2, . . . and 161-m, m D-type flip-flops (DFFs) 181-1, 181-2, . . . and 181-m without a reset function.

The third circuit 23 provided with m latch circuits, such as the m RAM cells 171-1, 171-2, . . . and 171-m, or the m DFFs 181-1, 181-2, . . . and 181-m, instead of the m RS latches 161-1, 161-2, . . . and 161-m also operates in a manner similar to that in the third circuit 23 provided with the m RS latches 161-1, 161-2, . . . and 161-m.

1.7 Capacitive Reactance Element

Figure 8:
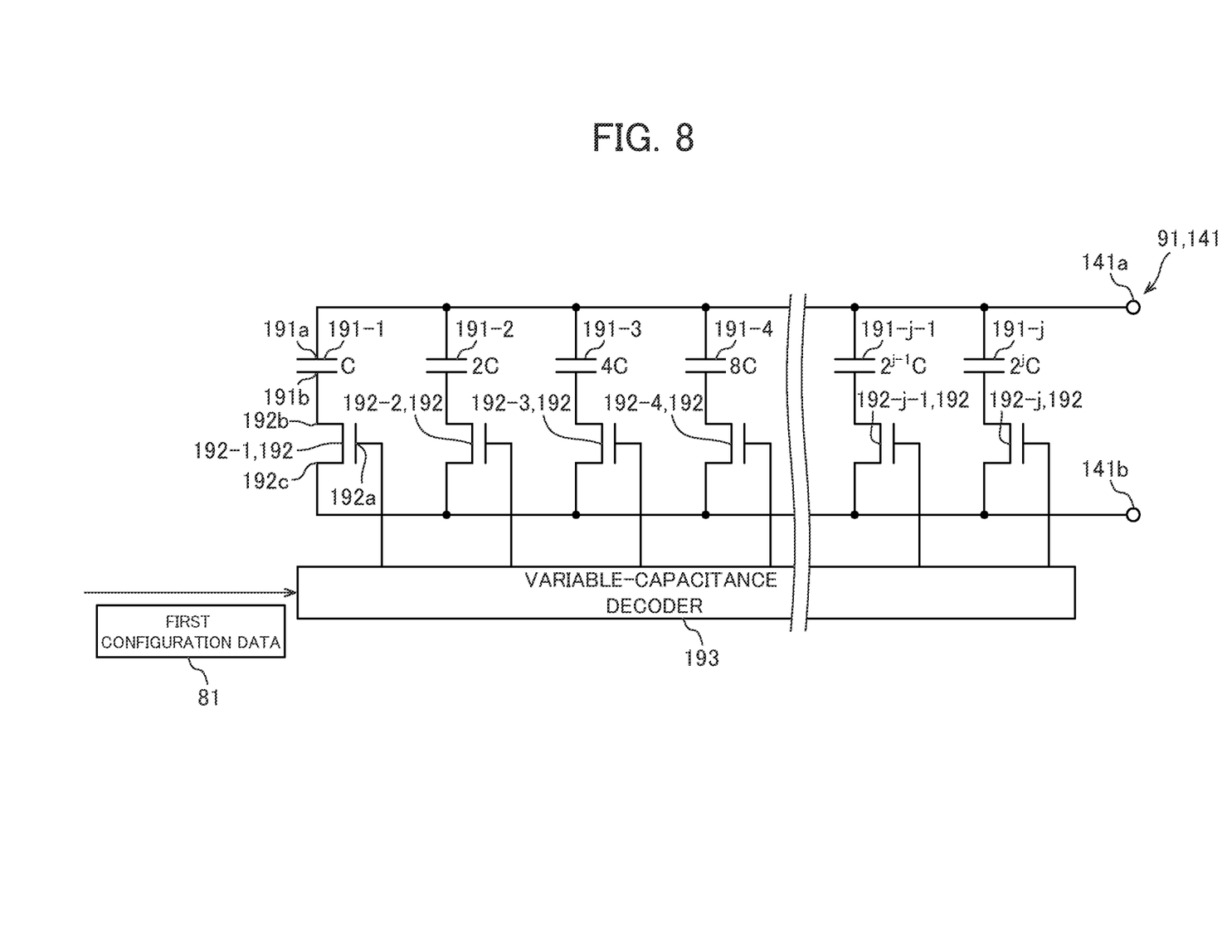
FIG. 8 is a circuit diagram of a capacitor included in the electronic circuit according to the first embodiment.

FIG. 8 is a circuit diagram of the capacitive reactance element included in the electronic circuit according to the first embodiment.

As illustrated in FIG. 8, the capacitive reactance element 141 includes capacitive reactance elements 191-1, 191-2, 191-3, 191-4, . . . , 191-$j$-1 and 191-$j$, switches 192-1, 192-2, 192-3, 192-4, . . . , 192-$j$-1 and 192-$j$, and a variable-capacitance decoder 193.

The capacitive reactance elements 191-1, 191-2, 191-3, 191-4, . . . , 191-$j$-1 and 191-$j$ respectively have capacitance values $C$, $2C$, $4C$, $8C$, . . . , $2^{j-1}C$ and $2^j C$.

Each switch 192 included in the switches 192-1, 192-2, 192-3, 192-4, . . . , 192-$j$-1 and 192-$j$ conducts a second terminal 192c of the switch 192 to a first terminal 192b of the switch 192 while a signal input to a control terminal 192a of the switch 192 is an ON signal. On the other hand, each switch 192 does not conduct the second terminal 192c of the switch 192 to the first terminal 192b of the switch 192 while the signal input to the control terminal 192a of the switch 192 is an OFF signal.

The capacitive reactance elements 191-1, 191-2, 191-3, 191-4, . . . , 191-$j$-1 and 191$j$ have their first terminals 191a electrically connected to the first terminal 141a of the capacitive reactance element 141.

The first terminals 192b of the switches 192-1, 192-2, 192-3, 192-4, . . . , 192-$j$-1 and 192-$j$ are electrically connected to respective second terminals 191b of the capacitive reactance elements 191-1, 191-2, 191-3, 191-4, . . . , 191-$j$-1 and 191-$j$.

The second terminals 192c of the switches 192-1, 192-2, 192-3, 192-4, . . . , 192-$j$-1 and 192-$j$ are electrically connected to the second terminal 141b of the capacitive reactance element 141.

Accordingly, the switches 192-1, 192-2, 192-3, 192-4, . . . 192-$j$-1 and 192-$j$ include the respective capacitance values of the capacitive reactance elements 191-1, 191-2, 191-3, 191-4, . . . , 191-$j$-1 and 191-$j$ in the capacitance value of the capacitive reactance element 141 while the signal input to the control terminals 192a of the switches 192-1, 192-2, 192-3, 192-4, ..., 192-j-1 and 192-j is an ON signal.

The variable-capacitance decoder 193 decodes the input first configuration data 81, to generate a signal that is to be input to the control terminals 192a of the switches 192-1, 192-2, 192-3, 192-4, ..., 192-j-1 and 192-j.

Accordingly, the capacitance value of a capacitive reactance element selected from among the capacitive reactance elements 191-1, 191-2, 191-3, 191-4, ..., 191-j-1 and 191-j in accordance with the first configuration data 81 can be included in the capacitance value of the capacitive reactance element 141. This enables the capacitance value of the capacitive reactance element 141 to be varied C by C from 0 to (C+2 C+4 C+8 C+ ... +$2^{j-1}$ C+$2^j$ C).

1.8 Resistance Element

Figure 9:
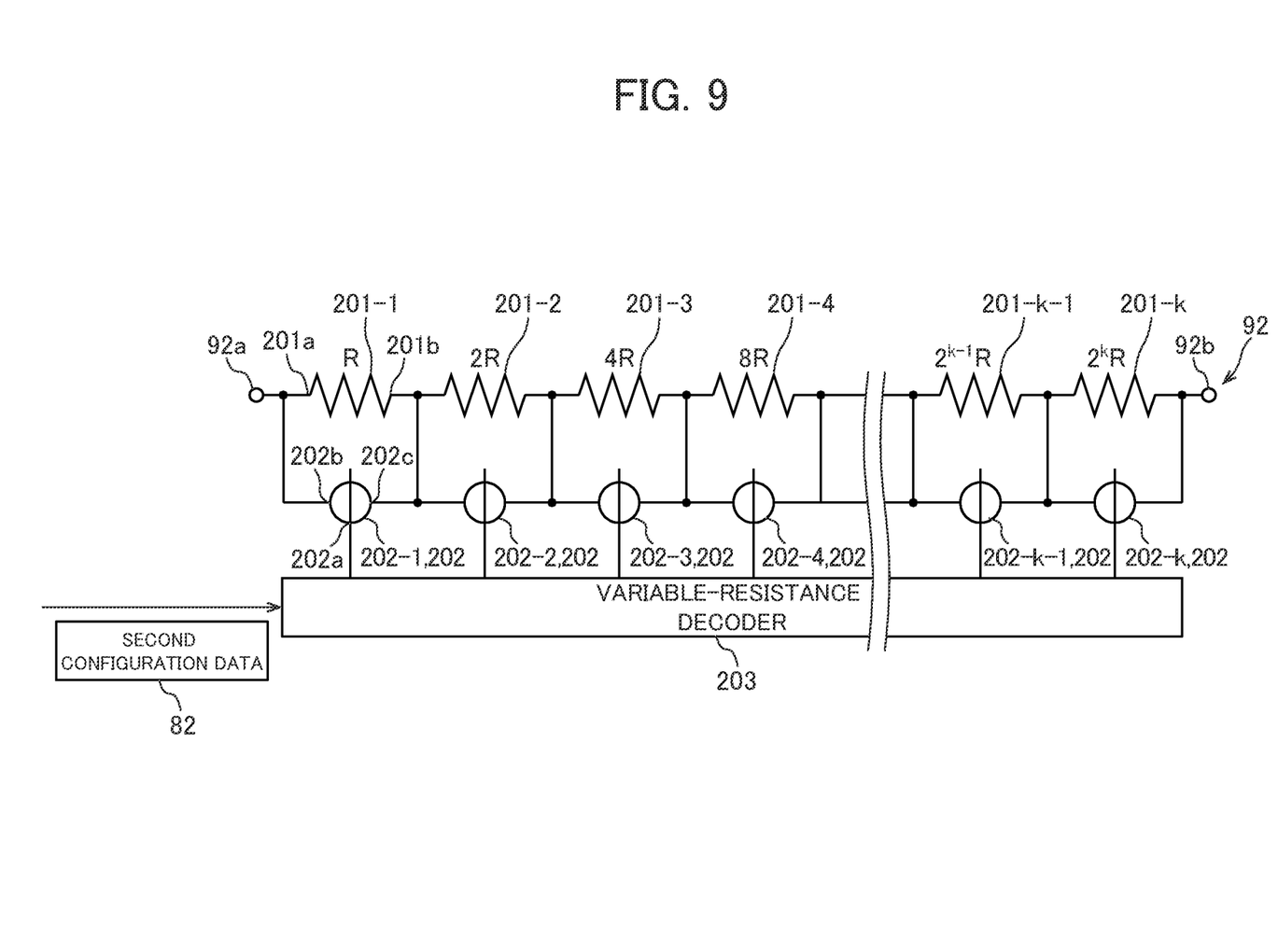
FIG. 9 is a circuit diagram of a resistor included in the electronic circuit according to the first embodiment.

As illustrated in FIG. 9, the resistance element 92 includes resistance elements (resistors) 201-1, 201-2, 201-3, 201-4, ..., 201-k-1 and 201-k, switches 202-1, 202-2, 202-3, 202-4, ..., 202-k-1 and 202-k, and a variable-resistance decoder 203.

The resistance elements 201-1, 201-2, 201-3, 201-4, ..., 201-k-1 and 201-k have their respective resistance values R, 2 R, 4 R, 8 R, ..., $2^{k-1}$ R and $2^k$ R.

Each switch 202 included in the switches 202-1, 202-2, 202-3, 202-4, ..., 202-k-1 and 202-k conducts a second terminal 202c of the switch 202 to a first terminal 202b of the switch 202 while a signal input to a control terminal 202a of the switch 202 is an ON signal. On the other hand, each switch 202 does not conduct the second terminal 202c of the switch 202 to the first terminal 202b of the switch 202 while the signal input to the control terminal 202a of the switch 202 is an OFF signal.

The resistance elements 201-2, 201-3, 201-4, ..., 201-k-1 and 201-k have their respective first terminals 201a electrically connected to second terminals 201b of the adjacent resistance elements 201-1, 201-2, 201-3, 201-4, ... and 201-k-1. The first terminal 201a of the resistance element 201-1, which is at one of the ends, is electrically connected to the first terminal 92a of the resistance element 92. The second terminal 201b of the resistance element 201-k, which is at the other end, is electrically connected to the second terminal 92b of the resistance element 92.

The first terminals 202b of the switches 202-1, 202-2, 202-3, 202-4, ..., 202-k-1 and 202-k are electrically connected to the respective first terminals 201a of the resistance elements 201-1, 201-2, 201-3, 201-4, ..., 201-k-1 and 201-k. The respective second terminals 202c of the switches 202-1, 202-2, 202-3, 202-4, ..., 202-k-1 and 202-k are electrically connected to the second terminals 201b of the resistance elements 201-1, 201-2, 201-3, 201-4, ..., 201-k-1 and 201-k.

Accordingly, the respective switches 202-1, 202-2, 202-3, 202-4, ..., 202-k-1 and 202-k electrically short-circuit the first terminals 201a and second terminals 201b of the resistors 201-1, 201-2, 201-3, 201-4, ..., 201-k-1 and 201-k while the signal input to the control terminals 202a of the switches 202-1, 202-2, 202-3, 202-4, ..., 202-k-1 and 202-k is an ON signal.

The variable-resistance decoder 203 decodes the input second configuration data 82, to generate a signal that is to be input to the switches 202-1, 202-2, 202-3, 202-4, ..., 202-k-1 and 202-k.

Accordingly, the first terminal 201a and second terminal 201b of a resistance element selected from among the resistance elements 201-1, 201-2, 201-3, 201-4, ..., 201-k-1 and 201-k in accordance with the second configuration data 82 can be electrically short-circuited. This enables the resistance value of the resistance element 92 to be varied R by R from 0 to (R+2 R+4 R+8 R+ ... +$2^{k-1}$ R+$2^k$ R).

Figure 10:
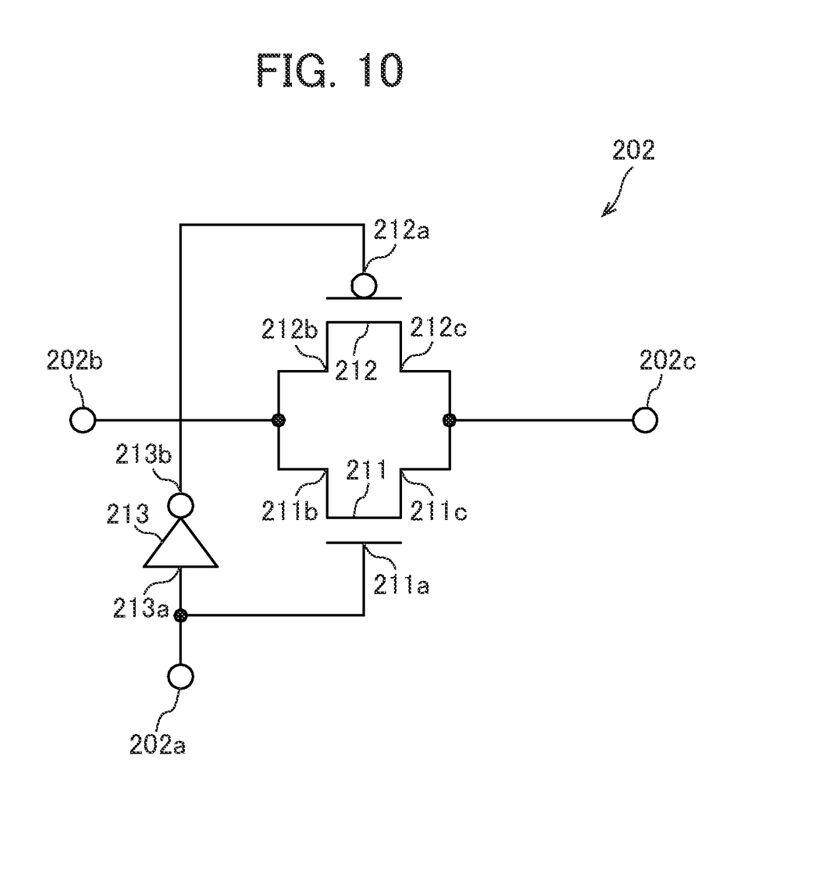
FIG. 10 is a circuit diagram of each switch included in a resistance element included in the electronic circuit according to the first embodiment.

As illustrated in FIG. 10, each switch 202 includes a first switching element 211, a second switching element 212, and an inverter 213.

The first switching element 211 conducts a second terminal 211c of the first switching element 211 to a first terminal 211b of the first switching element 211 while a signal input to a control terminal 211a of the first switching element 211 is an ON signal. On the other hand, the first switching element 211 does not conduct the second terminal 211c of the first switching element 211 to the first terminal 211b of the first switching element 211 while the signal input to the control terminal 211a of the first switching element 211 is an OFF signal.

The second switching element 212 conducts a second terminal 212c of the second switching element 212 to a first terminal 212b of the second switching element 212 while a signal input to a control terminal 212a of the second switching element 212 is an inverted ON signal. On the other hand, the second switching element 212 does not conduct the second terminal 212c of the second switching element 212 to the first terminal 212b of the second switching element 212 while the signal input to the control terminal 212a of the second switching element 212 is an inverted OFF signal.

The inverter 213 inverts a signal input to an input terminal 213a of the inverter 213 and outputs the inverted signal from an output terminal 213b of the inverter 213.

The first terminal 211b of the first switching element 211 and the first terminal 212b of the second switching element 212 are electrically connected to the first terminal 202b of the switch 202. The second terminal 211c of the first switching element 211 and the second terminal 212c of the second switching element 212 are electrically connected to the second terminal 202c of the switch 202. The control terminal 211a of the first switching element 211 is electrically connected to the control terminal 202a of the switch 202. The control terminal 212a of the second switching element 212 is electrically connected to the output terminal 213b of the inverter 213. The input terminal 213a of the inverter 213 is electrically connected to the control terminal 202a of the switch 202.

Accordingly, the signal input to the control terminal 211a of the first switching element 211 is an ON signal while the signal input to the control terminal 202a of the switch 202 is an ON signal. Further, the signal input to the control terminal 212a of the second switching element 212 is an inverted ON signal. Thus, the second terminal 211c of the first switching element 211 conducts to the first terminal 211b of the first switching element 211. Further, the second terminal 212c of the second switching element 212 conducts to the first terminal 212b of the second switching element 212. This conducts the second terminal 202c of the switch 202 to the first terminal 202b of the switch 202.

Figure 11:
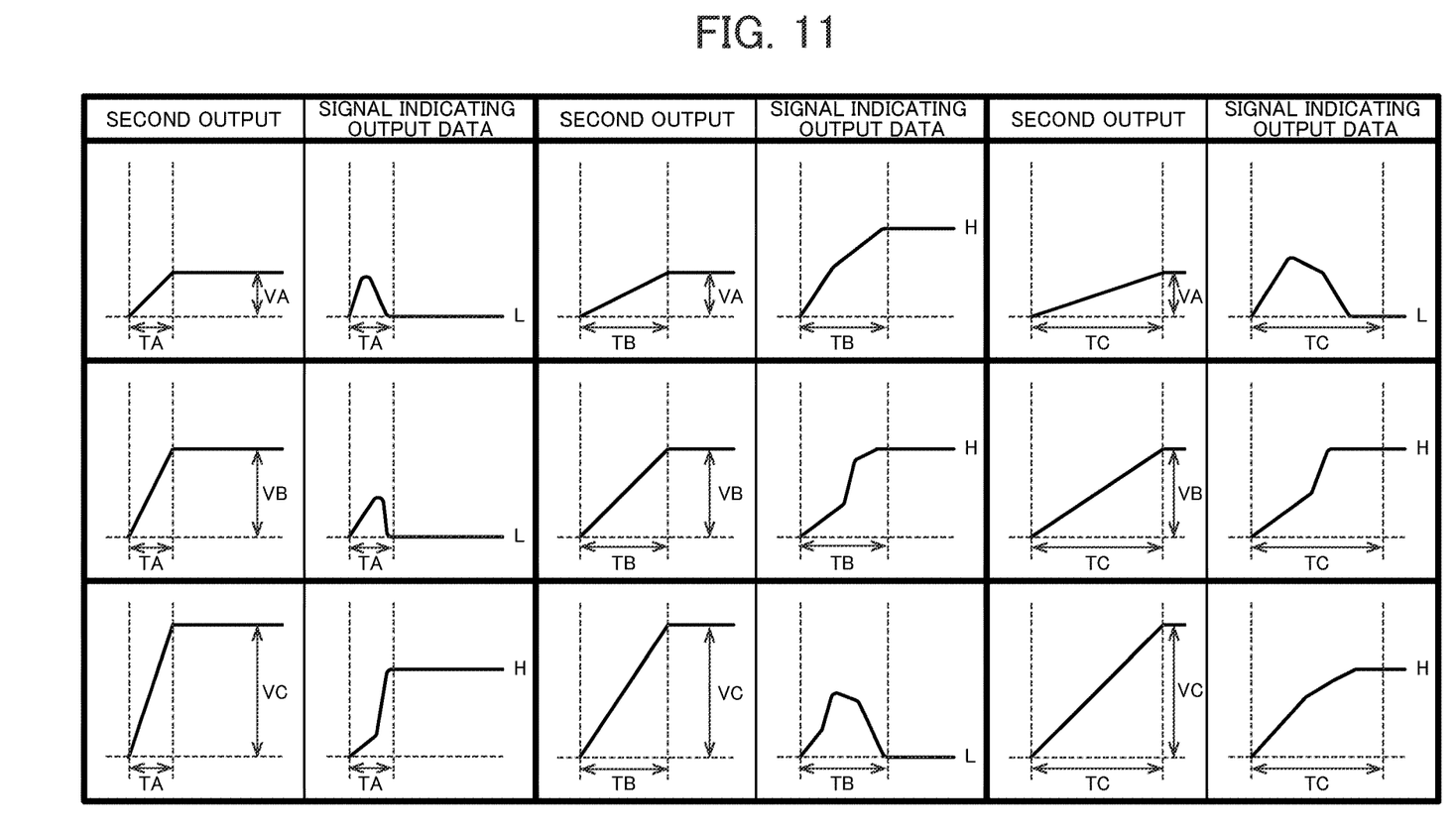
FIG. 11 illustrates an example waveform of a second output that is output by the second circuit included in the electronic circuit according to the first embodiment, and an example waveform of a signal that is output by an RS latch included in the electronic circuit.

1.9 Variation in Output Data Dependent on Second Post-Rise Voltage and Second Voltage-Rise Time FIG. 11 illustrates an example waveform of the second output, which is output by the second circuit included in the electronic circuit according to the first embodiment, and an example waveform of a signal that is output by the RS latch included in the electronic circuit.

The first circuit 21 varies the first post-rise voltage V1 of the generated first output 41 in accordance with the first data 31, which is included in the challenge data 11, as earlier described, and the first circuit 21 varies the second post-rise voltage V2 of the second output 42, which is output by the second circuit 22. For instance, the first circuit 21 varies the second post-rise voltage V2 within, but not limited to, VA, VB, and VC, as illustrated in FIG. 11. As such, the first circuit 21 varies the tilt of the waveform of the second output 42 at the time of its rise. The first circuit 21 can vary the tilt of the waveform of the second output 42 at the time of its rise without using the at least one impedance value 71.

Further, the second circuit 22 varies the second voltage-rise time TR2 of the second output 42 that is to be output, in accordance with the second data 32, which is included in the challenge data 11, as earlier described. For instance, the second circuit 22 varies the second voltage-rise time TR2 within, but not limited to, TA, TB, and TC, as illustrated in FIG. 11. As such, the second circuit 22 varies the tilt of the waveform of the second output 42 at the time of its rise. The second circuit 22 can vary the tilt of the waveform of the second output 42 at the time of its rise by the use of the at least one impedance value 71.

The third circuit 23 varies the value of a signal indicating output data, in accordance with the tilt of the waveform of the second output 42 at the time of its rise. The third circuit 23 thus varies this signal value indicating the output data, in accordance with the second post-rise voltage V2 and second voltage-rise time TR2 of the second output 42.

For instance, as illustrated in FIG. 11, for the second voltage-rise time T2 that is TA, the third circuit 23 sets the signal value at L when the second post-rise voltage V2 is VA, the third circuit 23 sets the signal value at L when the second post-rise voltage V2 is VB, and the third circuit 23 sets the signal value at H when the second post-rise voltage V2 is VC. Further, for the second voltage-rise time T2 that is TB, the third circuit 23 sets the signal value at H when the second post-rise voltage V2 is VA, the third circuit 23 sets the signal value at H when the second post-rise voltage V2 is VB, and the third circuit 23 sets the signal value at L when the second post-rise voltage V2 is VC. Further, for the second voltage-rise time T2 that is TC, the third circuit 23 sets the signal value at L when the second post-rise voltage V2 is VA, the third circuit 23 sets the signal value at H when the second post-rise voltage V2 is VB, and the third circuit 23 sets the signal value at H when the second post-rise voltage V2 is VC. As illustrated in FIG. 11, the third circuit 23 can vary the signal value in accordance with the second post-rise voltage V2 even when the second voltage-rise time T2 is the same.

Further, as illustrated in FIG. 11, for the second post-rise voltage V2 that is VA, the third circuit 23 sets the signal value at L when the second voltage-rise time T2 is TA, the third circuit 23 sets the signal value at H when the second voltage-rise time T2 is TB, and the third circuit 23 sets the signal value at L when the second voltage-rise time T2 is TC. Further, for the second post-rise voltage V2 that is VB, the third circuit 23 sets the signal value at L when the second voltage-rise time T2 is TA, the third circuit 23 sets the signal value at H when the second voltage-rise time T2 is TB, and the third circuit 23 sets the signal value at H when the second voltage-rise time T2 is TC. Further, for the second post-rise voltage V2 that is VC, the third circuit 23 sets the signal value at H when the second voltage-rise time T2 is TA, the third circuit 23 sets the signal value at L when the second voltage-rise time T2 is TB, and the third circuit 23 sets the signal value at H when the second voltage-rise time T2 is TC. As illustrated in FIG. 11, the third circuit 23 can vary the signal value in accordance with the second voltage-rise time T2 even when the second post-rise voltage V2 is the same.

The signal value starts varying in synchronization with the start of the rise of the second output 42 and settles at H or L before the end of the rise of the second output 42.

The third circuit 23 varies the signal value in accordance with a combination of the second post-rise voltage V2 and second voltage-rise time TR2 of the second output 42. This can increase the entropy of the signal value when compared with an instance where the third circuit 23 varies the signal value in accordance with only either one of the second post-rise voltage V2 and second voltage-rise time TR2.

The output signal value is affected by the parasitic capacitance and parasitic resistance of the electronic circuit 1 as well. Further, the parasitic capacitance and parasitic resistance of the electronic circuit 1 are different from electronic circuit 1 to electronic circuit 1. Hence, the output signal value is different from electronic circuit 1 to electronic circuit 1.

1.10 Processing that is Performed by Controller

Figure 12:
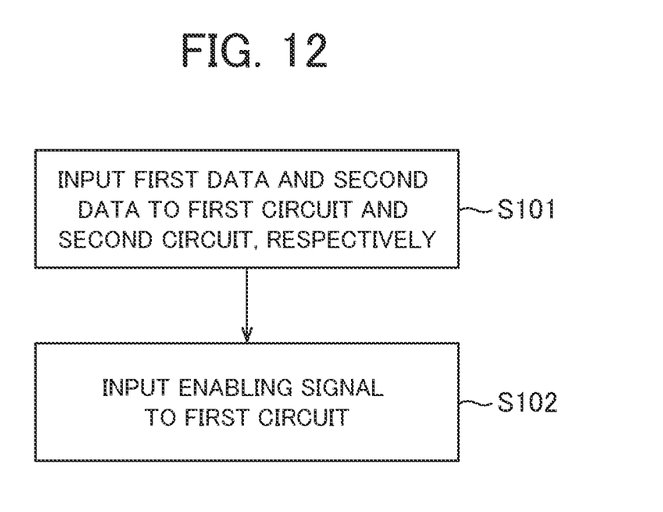
FIG. 12 is a flowchart showing processing that is performed by the controller included in the electronic circuit according to the first embodiment.

FIG. 12 is a flowchart showing processing that is performed by the controller included in the electronic circuit according to the first embodiment.

The controller 20 executes Steps S101 and S102 shown in FIG. 12.

In Step S101, the controller 20 inputs the first data 31 and the second data 32 to the first circuit 21 supplied with power-source electric power and supplied with no enabling signal 33, and the second circuit 22, respectively.

This brings the first circuit 21 into condition for outputting the first output 41 having the first post-rise voltage V1 corresponding to the first data 31. This also brings the impedance element 61, included in the second circuit 22, to have the impedance value 71 corresponding to the second data 32 and brings the impedance element 61 into condition for varying the first output 41 to the second output 42 having the second voltage-rise time TR2 corresponding to the second data 32.

In subsequent Step S102, the controller 20 inputs the enabling signal 33 to the first circuit 21. Accordingly, the first circuit 21 outputs the first output 41 having the first post-rise voltage V1 corresponding to the first data 31. Further, the second circuit 22 varies the first output 41 to the second output 42 having the second voltage-rise time TR2 corresponding to the second data 32. When the second circuit 22 is the integrator circuit 151 composed of the resistance element 92 and capacitive reactance element 141, the second voltage-rise time TR2 varies in accordance with a time constant $\tau = R \cdot C$, which is determined by the resistance value, R, of the resistance element 92 and the capacitance value, C, of the capacitive reactance element 141. Accordingly, the third circuit 23 outputs the response data 12 corresponding to the challenge data 11 including the first data 31 and second data 32.

The present disclosure is not limited to the foregoing embodiment. A replacement may be made with a configuration that is substantially the same as the configuration described in the foregoing embodiment, with a configuration that substantially exerts the same action and effect as the foregoing configuration, or with a configuration that can substantially achieve the same object as the foregoing configuration.

What is claimed is:
1. An electronic circuit comprising:
 a first circuit configured to generate a first output having a first voltage-rise time, and to vary a post-rise voltage of the first output in accordance with first data included in challenge data;

a second circuit configured to vary, in accordance with second data included in the challenge data, the first output to a second output having a second voltage-rise time different from the first voltage-rise time; and a third circuit in which an initial value is inconstant, and in which an output value varies in accordance with the second voltage-rise time, wherein the output value varies further in accordance with a post-rise voltage of the second output.

2. The electronic circuit according to claim 1, wherein the second circuit includes at least one impedance element having at least one impedance value that varies in accordance with the second data, and the at least one impedance element configured to vary the first output to the second output.

3. The electronic circuit according to claim 2, wherein
the at least one impedance value includes a reactance value that varies in accordance with first configuration data that is part of the second data, and
the at least one impedance element includes a reactance element having the reactance value.

4. The electronic circuit according to claim 3, wherein
the reactance value is a capacitive reactance value, and
the reactance element is a capacitive reactance element.

5. The electronic circuit according to claim 3, wherein
the at least one impedance value further includes a resistance value that varies in accordance with second configuration data that is part of the second data, and
the at least one impedance element includes a resistance element having the resistance value.

6. The electronic circuit according to claim 5, wherein
the reactance value is a capacitive reactance value,
the reactance element is a capacitive reactance element, and
the second circuit further includes an integrator circuit including the resistance element and the capacitive reactance element.

7. The electronic circuit according to claim 1, wherein the third circuit includes at least one selected from the group consisting of a set/reset (RS) latch, a D-type flip-flop, and a random-access-memory cell.

8. The electronic circuit according to claim 1, further comprising a controller configured to input an enabling signal to the first circuit after inputting the first data and the second data, respectively, to the first circuit and the second circuit,
wherein the first circuit starts generating the first output in synchronization with the input of the enabling signal.

9. The electronic circuit according to claim 1, wherein
the challenge data comprises a multi-digit bit string, the first data comprises a first bit string that is part of the multi-digit bit string, and the second data comprises a second bit string that is part of the multi-digit bit string and that is not the first bit string.

10. The electronic circuit according to claim 9, wherein
the second circuit includes at least one impedance element having at least one impedance value that varies in accordance with the second data, and the at least one impedance element is configured to vary the first output to the second output.

11. The electronic circuit according to claim 10, wherein
the at least one impedance value includes a reactance value that varies in accordance with first configuration data that is part of the second data, and
the at least one impedance element includes a reactance element having the reactance value.

12. The electronic circuit according to claim 11, wherein
the reactance value is a capacitive reactance value, and
the reactance element is a capacitive reactance element.

13. The electronic circuit according to claim 11, wherein
the at least one impedance value further includes a resistance value that varies in accordance with second configuration data that is part of the second data, and
the at least one impedance element includes a resistance element having the resistance value.

14. The electronic circuit according to claim 13, wherein
the reactance value is a capacitive reactance value,
the reactance element is a capacitive reactance element, and
the second circuit further includes an integrator circuit including the resistance element and the capacitive reactance element.

15. The electronic circuit according to claim 9, wherein
the third circuit includes at least one selected from the group consisting of a set/reset (RS) latch, a D-type flip-flop, and a random-access-memory cell.

16. The electronic circuit according to claim 9, further comprising a controller configured to input an enabling signal to the first circuit after inputting the first data and the second data, respectively, to the first circuit and the second circuit,
wherein the first circuit starts generating the first output in synchronization with the input of the enabling signal.

* * * * *